(12) United States Patent
Guggemos et al.

(10) Patent No.: US 6,806,034 B1
(45) Date of Patent: Oct. 19, 2004

(54) METHOD OF FORMING A CONDUCTIVE PATTERN ON DIELECTRIC SUBSTRATES

(75) Inventors: Michael Guggemos, Stahndorf (DE); Franz Kohnle, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 84 days.

(21) Appl. No.: 10/069,417

(22) PCT Filed: Jul. 18, 2000

(86) PCT No.: PCT/DE00/02423

§ 371 (c)(1),
(2), (4) Date: Feb. 25, 2002

(87) PCT Pub. No.: WO01/20059

PCT Pub. Date: Mar. 22, 2001

(30) Foreign Application Priority Data

Sep. 10, 1999 (DE) .......................... 199 44 908

(51) Int. Cl.⁷ ................................. G03F 7/26
(52) U.S. Cl. ................. 430/313; 430/311; 430/329
(58) Field of Search ................. 430/297, 311, 430/322, 323, 329, 313

(56) References Cited

U.S. PATENT DOCUMENTS 3,547,629 A 12/1970 Kinney
5,114,831 A 5/1992 Seitz et al. .................. 430/281
5,294,519 A 3/1994 Mori et al. .................. 430/313
6,593,249 B2 * 7/2003 Meyer et al. ................ 438/759

FOREIGN PATENT DOCUMENTS

| DE | 7 32 249 A1 | 9/1987 |
| DE | 41 31 065 A1 | 9/1991 |
| DE | 43 39 019 A1 | 11/1993 |
| EP | 0 178 864 A2 | 10/1985 |
| EP | 0 364 132 A1 | 9/1988 |
| EP | 0 619 333 A2 | 3/1994 |
| EP | 757 885 B1 | 12/1998 |
| WO | WO 97/15173 | 4/1997 |
| WO | WO 98/33951 | 8/1998 |

* cited by examiner

Primary Examiner—Kathleen Duda
(74) Attorney, Agent, or Firm—Paul & Paul

(57) ABSTRACT

To form a conductive pattern on dielectric substrates, a method is proposed in which a) a substrate covered with a metal film is coated with a protective layer which is formed by treating the metal film with a solution which contains at least one compound containing nitrogen, b) the protective layer is stripped away by UV radiation at least partially in the regions which do not correspond to the conductive pattern to be formed, in such a way that the metal film is exposed, and c) the exposed metal film is then removed by etching. By means of this method, extremely fine conductive patterns can be manufactured in a reproducible manner on dielectric substrates.

13 Claims, No Drawings

METHOD OF FORMING A CONDUCTIVE PATTERN ON DIELECTRIC SUBSTRATES

DESCRIPTION

The invention relates to a method of forming a conductive pattern on dielectric substrates covered with a metal film, preferably a layer of copper.

Many different methods have been proposed in the past for producing conductive patterns on electric circuit carriers. In the panel plating method, first of all a copper layer enclosing the drilled printed circuit board material on all sides is produced in the thickness required for the conductor structures. Then the regions of the outer sides of the printed circuit boards, which correspond to the conductor structures to be produced, are covered by a resist layer, such that these layers are preserved during the subsequent etching process. In the pattern plating method, first of all just a thin copper layer is formed on the printed circuit board material. To this is then applied for example a photoresist layer and the copper layer is exposed again by photostructuring at those locations which correspond to the conductor structures to be formed. To the exposed copper regions is applied a metal film. Then the photoresist layer is removed and the exposed copper layer is etched away. If a metal resist method is used, a metal resist layer, for example a tin/lead layer is applied as the electroplating resist.

These methods have considerable disadvantages. In particular it is not possible to manufacture in a reproducible manner, under production conditions, conductor structures with structure widths of less than 100 $\mu$m. Admittedly there has been no lack of attempts to achieve this goal. Circuits of this kind have been successfully produced with some expensive methods and initial materials. However methods of this kind do not come into consideration for mass production, since they are too expensive and extravagant and/or require very expensive initial products. These methods are not suitable however for producing circuits with structure widths of the conductor tracks which are less than 50 $\mu$m.

As an alternative etching resist film, a layer formed from imidazole or benzimidazole derivatives has been proposed. For example, in EP 0 178 864 A2, has been described a method of producing a printed circuit board which is through-hole plated with copper, which method consists in first forming the desired circuit pattern on the copper coating with an alkali-soluble resist, then forming an etching resist film by bringing the board into contact with an aqueous solution of an alkylimidazole at the exposed locations, and by the board then being dried and the exposed copper subsequently being removed by etching with an alkaline etching solution.

In EP 0 364 132 A1 it is mentioned that solutions which are suitable for forming a protective layer to protect against tarnishing can also be used as etch resists. Solutions of this kind contain imidazole compounds with a $C_{5-21}$-alkyl chain and in addition copper or zinc ions.

In EP 0 619 333 A2 are described methods of manufacturing conductor structures in which compounds containing nitrogen are used to form an etching resist film. As compounds containing nitrogen are used inter alia compounds, substituted with an alkyl chain with at least three carbon atoms, from the group imidazoles, benzimidazoles, triazoles pyrroles, pyrazoles, oxazoles, isoxazoles, thiazoles, benzothiazoles, indoles, adenine, purines, quinolines, pyrazines, quinazolines, guanine, xanthine, hypoxanthine, indazoles, creatinine, phenazines, and cupferron. To produce the conductor structures, first of all a negative image is formed with a standard resist which is removable in an alkaline solution, then the board is covered at the exposed regions with the etching resist film containing the nitrogen compounds, and thereafter the negative resist is removed again. Then the conductor structure can be formed by etching.

In DE 43 39 019 A1 is described a further method using a protective layer produced from imidazole and/or benzimidazole. In this case, the protective layer is formed exclusively on the perforation walls, after another layer has been formed on the outer sides of the printed circuit boards up to the edges of the perforations, which layer prevents the formation of the protective layer there. If a photosensitive lacquer is used for this other layer, the conductor structures can be produced by photostructuring.

In DE 37 32 249 A1 is quoted a method of manufacturing three-dimensional printed circuit boards in a subtractive/semi-additive technique with image transfer on an insulating substrate, in which the substrate covered with a copper layer is first coated on all sides with a tin-metal resist which can be deposited in an electroless manner and/or by electrodeposition, and the metal resist is then selectively irradiated with laser radiation but without any mask, such that the conductive pattern is produced as a negative. The exposed copper regions can then be removed by etching.

In DE 41 31 065 A1 is quoted a method of manufacturing printed circuit boards in which a metal layer and an etching resist film are applied in succession to an electrically insulating substrate, the etching resist film is removed by electromagnetic radiation in the regions directly adjoining the later conductor track pattern and the exposed regions of the metal layer are etched away down to the surface of the substrate in such a way that the conductor track patterns and island regions of the metal layer, electrically insulated therefrom by etching pits, remain on the substrate. Preferably the etching resist film is formed by electroless metal deposition. As an alternative to this, an organic material, for instance an electrodeposition paint can be used. To produce the electromagnetic radiation, a laser is preferably used, in particular an Nd-YAG laser. The etching pits are 150 $\mu$m wide. During the etching of the metal film, preferably a copper layer, under-etching of respectively 35 $\mu$m is detected at the edges of the etching pits.

In EP 0 757 885 B1 is disclosed a method of forming metallic conductive patterns with solderable and/or bondable connection regions on electrically insulating substrates, in which first of all a metallisation is applied to the substrate and then an organic, electroplating- and etch-resistant protective layer is deposited onto the metallisation in an electrodipping bath; thereafter the protective layer is removed again in the later connection regions by means of laser irradiation, then an etch-resistant, solderable and/or bondable end surface is electrodeposited on the exposed regions of the metallisation, the protective layer is removed by means of laser irradiation at least in the regions directly adjoining the later conductive pattern, and finally the exposed regions of the metallisation are etched away again to the surface of the substrate. In this case too, an Nd-YAG laser is mentioned as the radiation source. The etching pits formed have a width of 150 $\mu$m.

The known methods are either extremely extravagant and therefore expensive, or it does not prove possible to manufacture in a reproducible manner very fine structures having a structure width of 50 $\mu$m and less, especially of at the most 20 $\mu$m. The only known possibility consists in proceeding from a material which has a copper layer which is at least 5 μm thick. However producing materials of this kind is extremely extravagant in terms of process technology and thus expensive. When standard materials having a thick copper layer are used it has emerged that the conductor structures generally do not have a rectangular cross-section on account of not inconsiderable under-etching, such that their bearing surface on the substrate is very small and thus the desired adhesive strength of the conductor tracks is not achieved.

Underlying the present invention, therefore, is the problem of avoiding the disadvantages of the known methods and in particular of finding a method by means of which simple structuring can be carried out even in mass production, which structuring makes it possible to manufacture in a reproducible manner extremely fine structures having structure widths of 50 μm and less, especially 20 μm and less. Moreover the problems existing with the known methods in respect of the further processibility of the finished conductive pattern should not occur. The shape of the conductor tracks is intended to be reproducible also and the cross-section to come as close as possible to a rectangular shape. By this means it is intended also to guarantee that there is reliable contact between the conductor tracks and the metal film in the recesses to produce highly integrated circuits in the so-called "landless design". In the "landless design", no copper rings are formed around recesses which are present to serve the electrical connection of a plurality of conductor track planes. Moreover, the conductor tracks merge without widening into the metallisation of the walls of the recesses.

This problem is solved by the method according to claim 1. Preferred embodiments of the invention are quoted in the subordinate claims.

The method according to the invention serves to form a conductive pattern on dielectric substrates.

In particular, the method is used to create highly integrated circuit carriers for microelectronics. The method can naturally also be used for the manufacture of other products, for example to manufacture micro-reactors, storage media, solar collectors and metallic patterns on plastics materials to create decorative effects.

To accomplish the method according to the invention, a substrate covered with a metal film, preferably a layer of copper is used, and the metal film is removed by etching according to the structuring of the invention, such that the desired conductive pattern is produced. In order to structure the metal film, a) the substrate is coated with a protective layer which is formed by treating the metal film with a solution containing at least one compound containing nitrogen and b) the protective layer is then stripped away by UV radiation at least partially in the regions not corresponding to the conductive pattern to be formed, in such a way that the metal film is exposed.

c) the exposed metal film is removed by etching.

As the energy radiation, preferably laser radiation is used since this radiation has the required properties to be able to manufacture the extremely fine structures, and since in laser radiation a sufficiently high energy density is achieved to strip away the protective layer.

To remove the protective layer selectively in the metal layer regions to be exposed, preferably an excimer laser is used which can in particular be pulsed. This radiation source is particularly well suited to stripping away the thin protective layers consisting of organic material without leaving any residue. In principle other types of lasers can also be used. When these laser types are used, however, it cannot be guaranteed that the protective layers are used without leaving any residue.

With the method according to the invention, conductive patterns can be formed which have structure widths of the conductor tracks of 50 μm and less, and in particular of 20 μm and less. For example conductor tracks with a practically rectangular cross-section with a base width of 50 μm can be formed. The form of the conductor track cross-section corresponds substantially to a trapezium, it being noticed that the base area of the conductor tracks adjoining the dielectric is broader than the surface. In this way, a large contact surface of the conductor tracks to the dielectric and thus optimum adhesive strength on the substrate is achieved. The steepness of the conductor track edges, referred to as under-etching, is in the region of 2.5 μm with conductor tracks which are approximately 20 μm wide and 20 μm high. This means that the base surface at each edge of the conductor tracks projects by the quoted distance below the surface of the conductor tracks. If for example conductor tracks having a base surface width of 15 μm are produced, the width of the conductor track surface is approximately 11 μm.

The conductor track width can also be set in a reproducible manner. For example, conductor tracks having a substantially constant structural width of roughly 20 μm or even less (for example 10 μm) can be obtained. The fluctuation in the width, however is within roughly ± 1 μm. By this means the electrical integrity of the whole electrical circuit is ensured; this means for example that a reproducible impedance of the circuit is guaranteed.

In particular the problems which are observed with the method described in DE 37 32 249 A1 do not occur when the method according to the invention is used. Defects in the subsequent etching of the exposed copper layer are not observed. All the surface regions of the circuit to be processed, in which regions the protective layer is removed by the laser treatment, can be etched without problem, without residues remaining. When the method described in DE 37 32 249 A1 is used on the other hand it is noted that even after the laser stripping still considerable amounts of tin can be found in the copper surface regions which had in fact been previously freed of tin, such that the etching result is not satisfactory. Basically this method is only suitable for manufacturing conductor tracks having a minimal width of roughly 120 μm. If an attempt is made to manufacture by means of this method circuit carriers having structure widths of the conductor tracks which are less than 50 μm, no reproducible results are obtained any more. The shape and width of the conductor tracks fluctuates within very wide limits. The gaps between the conductor tracks are partially even either connected to one another or breaks in the conductor tracks are observed. Partially, too, pitting-like cauterisations in the etching of the conductive pattern were observed after the copper layer had been removed by etching.

Moreover the conductive patterns produced with this method frequently cause problems in subsequent processes, for example in the application of a soldering stop mask and in methods in which nickels/gold layer combinations are deposited as the end layers. In the first case, the mask does not adhere sufficiently to the conductor structures, and in the second case the copper structures which are freed again of the tin layer cannot be perfectly etched in order to form the nickel/gold layer. Furthermore it is not easily possible to remove the tin layer from fine bores again after etching. In particular with processing of substrates with blind holes, considerable problems arise in the removal of the tin layer from the holes. Moreover very expensive etching solutions which are dubious in terms of waste water technology have to be used to remove the tin layer.

When the methods described in DE 41 31 065 A1 and EP 0 757 885 B1 are used, no satisfactory results are obtained in the manufacture of circuit carriers having conductor track widths of less than roughly 75 $\mu$m. In this case, the conductor track edges are also not exactly defined, such that the continuing attempt to produce conductor tracks with a width of 50 $\mu$m and less fails completely. Moreover in this case it is also noticed that when the organic protective layers are stripped away by means of laser radiation, residues remain on the metal surfaces such that problems arise in the subsequent etching.

With the method according to the invention it is furthermore possible without any problem to manufacture circuit carriers in the so-called "landless design".

By the cross-section of the conductor tracks being formed in a reproducible manner, no problems arise in the realisation of this technique. Pitting-like cauterisations in the conductive pattern are also not observed after the etching of the copper layer.

Furthermore no problems arise in the removal of the protective layer after the etching of the copper layer.

In addition to this, in contrast to the known methods, the protective layer can be removed from very narrow recesses and even blind holes by means of diluted inorganic acid.

Furthermore there are no problems in the further processing of the etched circuit carriers if the method according to the invention is used. In contrast to the known methods, the application of a solder stop mask causes in this case just as few difficulties as the subsequent deposition of a nickel/gold end layer. When the method according to the invention is used, the adhesive strength of the solder stop mask on the conductor tracks is sufficiently high; when the known methods are used, on the other hand, the surfaces of the conductor tracks cannot be satisfactorily etched before the end layer is applied.

If the method according to the invention is used, the waste water treatment of the liquids occurring when the protective layer is removed does not present any problems.

By comparison with the conventional structuring techniques using photo- or screen printing resists, the stripping method according to the invention is substantially shorter and requires fewer method steps. In particular, no developing step is necessary for the protective layer.

To produce the protective layer, the copper layers are brought into contact with an acid solution, which preferably contains water as a solvent, possibly also other solvents than just water alone, in a mixture with water or with one another. The solution contains at least one compound containing nitrogen, for example a cyclic, preferably heterocyclic and/or aromatic compound, in particularly substituted with alkyl side chains or an oligomer or polymer of the cyclic compounds, and other constituents.

As compounds containing nitrogen, preferably cyclic compounds substituted with alkyl, aryl and/or aralkyl groups are used, for example compounds from the substance classes: imidazoles, benzimidazoles, triazoles, benzotriazoles, pyrroles, pyrazoles, oxazoles, isoxazoles, thiazoles, benzothiazoles, indoles, adenine, purines, quinolines, pyrazines, quinazolines, guanine, xanthine, hypoxanthine, indazoles, creatinine, phenazines, cupferron, tetrazoles, thiadiazoles, thiatriazoles, isothiazoles as well as derivatives of same, the alkyl groups having at least three carbon atoms.

Alternatively compounds containing oligomer or polymer chains can also be used as compounds containing nitrogen, to which the previously-mentioned compounds are linked. For example, polyvinyl imidazole forms an extremely etch-resistant etching layer.

The concentration of these substances in the solution can be used for example in the range between 0.001 g/l and 400 g/l, preferably between 1 g/l and 50 g/l.

Moreover the solution containing the nitrogen compounds contains at least one acid, for example phosphoric acid, sulphuric acid, hydrochloric acid, phosphorous acid, formic acid, ethanoic acid, glycolic acid, oxalic acid, succinic acid, maleic acid, tartaric acid, adipic acid or lactic acid.

The pH value of the solution should be smaller than 7 and is preferably in the range between 2 and 5.

The solution can also contain further constituents, for example basic substances to stabilise the pH (buffering), copper and/or other heavy metal salts to harden the layer. As basic substances, preferably alphatic amines can be used, for example ethylene diamine, mono-alkylamines, dialkylamines and ethanolamines, such as mono-, di- and triethanolamine.

To form the protective layer, the solution is heated to a temperature of preferably 30° C. to 95° C. and brought for roughly 2 to 10 minutes into contact with the substrate.

In a method variant, the substrate, whilst being brought into contact with the solution, is electrically connected to an external current source and a counter-electrode which is also in contact with the solution, or directly to a second electrode, which is also brought into contact with the treatment solution. Here the protective layer is formed by an electrochemical reaction in that, whilst the copper layers are brought into contact with the solution containing compounds containing nitrogen, an electric voltage is applied at least intermittently between the copper layers and the electrodes or, as a result of the standard potential difference of the copper layers and the electrodes, occurs in such a way that the copper layers are polarised as the anode and the electrode as the cathode. By this means an electrical current flows between the copper layers and the electrodes.

The voltage between the second electrode or the counter-electrode and the substrate is preferably set in the region between 0.5 volts and 1.5 volts. The current arising is preferably in the range between 0.1 A/dm$^2$ and 1 A/dm$^2$.

If no external current source is used and the substrate is directly connected to the second electrode, a metal is used as the material for the electrode, which behaves as a nobler metal than copper, for example stainless steel or gold.

After the protective layer has been formed, the substrate is dried in order to solidify the protective layer. For this purpose, the substrate is dried for example in a circulating drier or, with this method, an infrared radiation heating device. A combination of continuous drier and infrared radiation heating device or a hot air process can be used.

Thereafter the substrate is exposed with UV radiation, preferably with laser radiation. The protective layer can be removed by a laser beam being moved over the protective layer. By this means the regions of the protective layer which do not correspond to the conductive pattern to be formed are removed. The laser serves to break up the organic material of the protective layer and transfer it into the gas phase. As the laser, preferably a pulsed excimer laser is suitable, by means of which the bonds in the organic molecules can be broken up (photolytically). The gaseous products produced can be extracted via suitable pump systems from the immediate environment of the substrate in order to prevent a renewed layer formation.

To copy the conductive pattern onto the substrate covered with the metal film, in particular a mask through which the UV radiation is radiated can be used.

Particularly favourable is an imaging arrangement in which the mask is brought, at a spacing from the substrate, into the parallel beam path of the laser (off contact process). The pattern of the mask is then directly transferred to the substrate. To produce the mask, preferably a thin chromium layer structured with the conductor track pattern is used on a quartz carrier. Masks of this kind can be produced with a resolution of roughly 0.2 $\mu$m. Furthermore an imaging lens system can be introduced into the beam path between mask and substrate, by means of which system the mask image on the protective layer can be copied in enlargement or in reduction. The substrate is then not in the focus of the imaging lens system. If the mask is not completely illuminated by the laser beam, because the laser beam does not have an adequately large beam cross-section, either the mask can be moved perpendicularly to the laser beam or the laser beam can be moved over the mask, such that the laser beam covers all the regions of the mask in sequence. By this means, the pattern of the mask can be scanned on. If the mask is moved, the substrate is also moved in a movement co-ordinated therewith.

In an alternative arrangement, the mask can also be placed into direct contact with the protective layer surface. By this means under-radiation effects are admittedly more easily avoidable than with the off-contact method. This arrangement has the disadvantage, however, that an imaging lens system to enlarge or reduce the mask image cannot be used. Moreover the pattern of the mask cannot be reproduced on the protective layer surface several times by suitable co-ordinated movement of the mask relative to the substrate. The problem of under-radiation when the off-contact method is used can be largely eliminated by suitable additional screen systems being used to shield from stray radiation at the edge.

In principle, the conductor structure can also be "written" onto the protective layer surface with a focussed laser beam without a mask (laser direct imaging). By a very sharply focussed laser beam being used, from which possibly the stray radiation surrounding the main beam has also been eliminated and which is moved over the protective layer surface, very fine structures can also be formed in the protective layer (50 $\mu$m)

Then the exposed copper regions are removed in an etching process. For this purpose, preferably an alkaline copper etching solution (ammoniacal copper(II) chloride etching solution) is used. Thus the conductive pattern is formed.

Thereafter the protective layer is removed from the copper structures formed. An acid solution is used for this purpose. Inter alia an aqueous solution of an inorganic acid can be used, for example a diluted hydrochloric or sulphuric acid solution.

The copper pattern produced has sharp-edged, very fine copper structures, which have steep and straight edges.

The copper layers can be treated in different method techniques. For example, the substrates provided with the copper layers can be dipped into the treatment solutions by being lowered into baths which are contained in tanks. A preferred method of bringing the substrates into contact with the treatment solution consists in using a horizontal continuous process to form the protective layer and to remove the exposed copper layers. This method consists in the substrates being led through such a system in a horizontal direction of conveyance. Here the substrates are held either perpendicular or horizontal. The substrates can here again be guided in a horizontal or respectively vertical conveying plane. The solutions can be brought to the substrate surfaces by means of suitable nozzles, for example with surge, spray or atomising nozzles. With the nozzles, forced flooding even of the finest recesses is guaranteed.

To manufacture the highly integrated circuit carriers, basic materials can be used which comprise a dielectric which is provided on one or both sides with copper layers. Basic materials of this kind can be firstly produced in a conventional manner by laminating copper foils with a resin-saturated glass fibre fabric which is not yet hardened or by pouring or laminating resin onto a stable carrier substrate and hardening the resin. The carrier substrate is preferably formed in a conventional manner as a multi-layer circuit carrier which has coarser circuit structures, for example for earthing, supplying current or shielding, which are connected in a suitable manner via through-hole plated recesses to one another and/or to signal wiring levels on the additionally applied dielectric layers. Corresponding to the requirement of wiring density, the dielectric layers can be applied to the carrier substrate on one or both sides.

Conceivable, too, is the possibility of multiple coatings, with respective formation of a conductive pattern in the new layer. By this means, the signal wiring density can be increased practically in any way. It is here obvious that, before an additional dielectric layer is constructed, the respective conductive pattern must be completed.

The copper layers in the individual layers can be produced by metallisation of the dielectrics. Metallisation methods by means of which a sufficiently adhesive bond between the copper layer and the dielectric can be achieved are known. For example the resin can be metallised in a chemical manner after suitable etching pre-treatment. To this end, the dielectric is for example first activated with noble metal salts and then copper-plated in an electroless manner and possibly electrolytically. In another type of method the dielectric can also be metallised by means of a plasma process. To this end, the dielectric is first etched in a glow discharge and thereafter —also in a glow discharge—coated with noble metal salts (PECVD method, physical application methods such as sputtering etc.) such that then copper can be deposited, securely adhering, by means of a currentless and if necessary an electrolytic method.

The electrolytic method of applying copper to the dielectric can be deposited in conventional manner with direct current, but advantageously also with a pulse method (pulse plating), in which unipolar or bipolar current or voltage pulses are used. Typically a roughly 10 $\mu$m to 20 $\mu$m thick copper layer is formed.

The following examples serve to explain the invention in greater detail:

EXAMPLE 1

An insulating material board (FR4 material: glass fibre mats saturated with flame-inhibiting resin, hardened), coated on one side with a copper foil which is 17.5 $\mu$m thick, was strengthened in an electroplating sulphuric acid copper bath (20 g/l $Cu^{2+}$ as copper sulphate, 200 g/l $H_2SO_4$, 50 mg/l Cl as NaCl, brightening agent, levelling agent) to a thickness of 20 $\mu$m.

Then the copper-plated board is dipped into a coating solution to form the protective layer. This solution has the following composition:

| | |
|---|---|
| 2-n-pentyl benzimidazole | 10 g |
| formic acid | 32 g |
| copper (II) chloride | 1.0 g |
| fill up with water to | 1 l. |

The board was treated for 5 minutes in the solution heated to 40° C., then rinsed with water and thereafter dried in a circulating drier for 10 minutes at 130° C.

Through treatment with the solution, a thin (in the region of 1 to 10 µm thick) organic film was formed as a protective layer on the copper layer.

In an alternative test, instead of 2-n-pentyl benzimidazole, the compound 2-n-heptyl benzimidazole was used. The same result was obtained.

To form conductor structures having structure widths of 20 µm, the protective layer was thereafter structured by means of a pulsed excimer laser with an initial laser output of 50 W and an energy density of 150 mJ/cm$^2$ to 200 mJ/cm$^2$. To this end, a mask (structured chromium layer with a conductive pattern on a quartz plate) was brought into the beam path of the laser. Between the mask and the insulating material board, an imaging lens system was so positioned that the insulating material board was disposed on the opposite side of the focal point of the beam, seen from the lens system. The conductive pattern of the mask was thus copied with a linear factor 2 onto the protective layer. Since the laser beam only illuminated a small portion of the mask, the mask and the insulating material board were moved in a co-ordinated manner perpendicularly to the beam axis and in the opposite direction, such that the whole conductive pattern was copied in sequence onto the protective layer.

The copper exposed during the laser structuring was then removed with an ammoniacal CuCl$_2$ etching solution.

Following this, the organic layer was removed again in a 3 wt/% HCl solution.

A pattern was formed consisting of copper conductor tracks, the conductor tracks having a width of roughly 20 µm (at the base) and a thickness of 20 µm.

The etching result was verified by scanning electron micrographs: the conductor tracks had a very regular cross-section which was configured trapezoid. The bearing surface of the conductor tracks on the FR4 material was greater than the surface of the conductor tracks. The edges of the conductor tracks were formed regular and straight and so steep that the under-etching was 2.5 µm.

Indentations, funnel-shaped cauterisations and other irregularities were not detected.

These results were obtained both with the coating solution containing 2-n-pentyl benzimidazole and with the coating solution containing 2-n-heptyl benzimidazole.

EXAMPLE 2

The test of Example 1 was repeated, the treatment in the benzimidazole solution to form the protective layer was carried out with a flow of current. For this purpose, an additional electrode formed from platinum-plated expanded titanium metal was brought into contact with the solution and between the copper layers and the electrode a voltage was set such that a current of roughly 0.2 A/dm$^2$, (in relation to the copper layers) flowed.

The same solution was used to form the protective layer as in Example 1 and the same arrangement to form the conductive pattern in the protective layer with the excimer laser.

The etching result was the same as in Example 1.

EXAMPLE 3

Example 2 was repeated. However a solution which contained no copper(II) chloride was used to form the copper layer.

The etching result was the same as in Example 1.

What is claimed is:

1. Method of forming a conductive pattern on dielectric substrates, characterized in that:
   a) a substrate covered with a metal film is coated with a protective layer which is formed by treating the metal film with a solution containing at least one compound containing nitrogen,
   b) the protective layer is stripped away by UV radiation at least partially in the regions not corresponding to the conductive pattern to be formed, said protective layer being exhausted into a gas phase by the UV radiation stripping action, in such a way that the metal film is exposed, and
   c) the exposed metal film is removed by etching.

2. Method according to claim 1, characterised in that the conductive pattern is formed on a substrate covered with a copper layer.

3. Method according to any one of claims 1–2, characterised in that laser radiation is used as the UV radiation.

4. Method according to any one of claims 1–2, characterised in that the protective layer is removed, using a pulsed excimer laser, in the metal film regions to be exposed in method step b).

5. Method according to claim 3, characterised in that a mask through which UV radiation passes is used to copy the conductive pattern onto the substrate covered with the metal film.

6. Method according to claim 1, characterised in that the compounds containing nitrogen are selected from the group of compounds, comprising the following substituted with alkyl, aryl and/or aralkyl groups: imidazoles, benzimidazoles, triazoles, benzotriazoles, pyrroles, pyrazoles, oxazoles, isoxazoles, thiazoles, benzothiazoles, indoles, adenine, purine, quinolines, pyrazines, quinazolines, guanine, xanthine, hypoxanthine, indazoles, creatinine, phenazines, cupferron, tetrazoles, thiadiazoles, thiatriazoles, isothiazoles as well as derivatives of same, the alkyl groups having at least three carbon atoms.

7. Method according to claim 1, characterised in that the compounds containing nitrogen contain oligomer or polymer chains to which compounds are linked which are selected from the group of compounds comprising the following substituted with alkyl, aryl, and/or aralkyl groups: imidazoles, benzimidazoles, triazoles, benzotriazoles, pyrroles, pyrazoles, oxazoles, isoxazoles, thiazoles, benzothiazoles, indoles, adenine, purine, quinolines, pyrazines, quinazolines, guanine, xanthine, hypoxanthine, indazoles, creatinine, phenazines, cupferron, tetrazoles, thiadazoles, thiatriazoles, isothiazoles as well as derivatives of same, the alkyl groups having at least three carbon atoms.

8. Method according to any one of claims 1–2, characterised in that the protective layer is formed by bringing the metal layers into contact with an aqueous acid solution of the compound containing at least one nitrogen.

9. Method according to any one of claims 1, 6 and 7, characterised in that the solution to form the protective layer contains at least one acid selected from the group comprising phosphoric acid, sulphuric acid, hydrochloric acid, phosphorous acid, formic acid, ethanoic acid, glycolic acid, oxalic acid, succinic acid, maleic acid, tartaric acid, adipic acid and lactic acid.

10. Method according to any one of claims 1, 2, 6 and 7, characterised in that the protective layers is formed by an electrochemical reaction, in that, as the metal layers are brought into contact with the solution which contains the compounds containing nitrogen, an electric voltage is applied at least intermittently between the metal layers and electrodes brought into contact with the solution, or arises as a result of the standard potential difference of the metal layers and the electrodes in such a way that the metal layers are polarised as the anode and the electrode as the cathode, such that an electrical current flows between the metal layers and the electrodes.

11. Method according to any one of claims 1, 2, 6 and 7, characterised in that the exposed metal film is removed with an alkaline metal etching solution.

12. Method according to any one of claims 1–2, characterised in that a horizontal continuous process is used to form the protective layer and remove the exposed metal layers.

13. Method according to any one of claims 1, 2, 6 and 7, characterised in that the protective layer is stripped away after the metal film has been removed.

* * * * *